(12) United States Patent
Chen et al.

(10) Patent No.: US 8,811,604 B2
(45) Date of Patent: Aug. 19, 2014

(54) SLIDING MECHANISM AND SLIDER ELECTRONIC APPARATUS THEREWITH

(71) Applicant: Wistron Corporation, New Taipei (TW)

(72) Inventors: Hung-Chih Chen, New Taipei (TW); Chen-Yi Liang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 0 days.

(21) Appl. No.: 13/858,953

(22) Filed: Apr. 9, 2013

(65) Prior Publication Data

US 2014/0098473 A1    Apr. 10, 2014

(30) Foreign Application Priority Data

Oct. 9, 2012    (TW) .............. 101137318 A (51) Int. Cl.
H04M 1/00  (2006.01)
H04M 9/00  (2006.01)
H04M 1/02  (2006.01)
H05K 5/02  (2006.01)

(52) U.S. Cl.
CPC .......... H04M 1/0235 (2013.01); H05K 5/0217 (2013.01)
USPC .................. 379/433.12; 455/575.4

(58) Field of Classification Search
USPC .......... 379/433.11, 433.12; 455/575.1, 575.3, 455/575.4; 361/679.02, 679.09, 679.22, 361/679.27, 679.56; 16/302, 327, 364
See application file for complete search history.

(56) References Cited

U.S. PATENT DOCUMENTS

| 7,496,194 | B2* | 2/2009 | Jeun .................... 379/433.11 |
| 7,561,443 | B2* | 7/2009 | Todoroki et al. ............. 361/814 |
| 7,646,866 | B2* | 1/2010 | Lin et al. .................. 379/433.12 |
| 8,218,758 | B2* | 7/2012 | Chen ....................... 379/433.12 |
| 2012/0154999 | A1 | 6/2012 | Park |

* cited by examiner

Primary Examiner — Tuan D Nguyen
(74) Attorney, Agent, or Firm — Winston Hsu; Scott Margo (57) ABSTRACT

A sliding mechanism and a slider electronic apparatus therewith are disclosed. The sliding mechanism is disposed in a casing of the slider electronic apparatus and includes a slide, a retaining wall, and a sliding member. The slide and the retaining wall are oppositely fixedly disposed. The sliding member is disposed to be slidable on the slide and keeps pushing the retaining wall. The retaining wall applies a reaction force on the sliding member to drive the sliding member to move on the slide. Another casing of the slider electronic apparatus is connected to the sliding member so as to be capable of moving together with the sliding member. Therein, a relatively shortest distance exists between the retaining wall and the slide. When the two casings are moved relatively, the casings can be kept moving automatically by the reaction force.

20 Claims, 10 Drawing Sheets

SLIDING MECHANISM AND SLIDER ELECTRONIC APPARATUS THEREWITH

BACKGROUND OF THE INVENTION

1. Field of the Invention

The invention relates to a sliding mechanism and a slider electronic apparatus, and especially relates to a sliding mechanism for driving a casing to move and a slider electronic apparatus therewith.

2. Description of the Prior Art

Current slider electronic apparatuses usually use a slide mechanism for moving the casing thereof. For an example of a tablet computer, when it is required to be used, a user needs to push its screen casing to move relative to its system casing until the screen casing reaches a predetermined position. The predetermined position can be a position where the screen casing is located when the tablet computer is structurally opened or closed. No matter during opening the screen casing or closing the screen casing, the user needs to apply a force on the screen casing to move through the opening or closing operation, which is quite inconvenient. Furthermore, in order to constrain the screen casing at the predetermined position stably, the above slide mechanism usually uses frictional force or a positioning structure for positioning. In the former, the user needs to apply a larger force to move the screen casing. In the latter, the user needs to keep in contacting the screen casing for avoiding an unexpected movement of the screen casing. In addition, if the user does not push the screen casing to the positioning structure really, the screen casing may move unexpectedly when in use, which is also inconvenient in use.

SUMMARY OF THE INVENTION

An objective of the invention is to provide a sliding mechanism, installed in a slider electronic apparatus with slidable casing. The sliding mechanism uses a retaining wall for generating a reaction force to drive the sliding member to move on the slide thereof, so that the sliding mechanism can provide a function of moving a casing without being forced by a user through the movement.

The sliding mechanism of the invention is installed in a slider electronic apparatus. The slider electronic apparatus includes a first casing and a second casing. The sliding mechanism includes a slide, a retaining wall, and a sliding member. The slide is fixedly disposed in the first casing and extends in an extending direction. The retaining wall is fixedly disposed opposite to the slide in the first casing and extends substantially in the extending direction. A distance in a direction perpendicular to the extending direction between the retaining wall and the first slide varies along the extending direction. The distance includes a relatively shortest distance. The sliding member includes a sliding base, a pushing part, and a thrust force generating structure. The sliding base is disposed to be slidable on the slide and connected to the second casing. The pushing part is connected to the sliding base and capable of moving relative to the sliding base. The thrust force generating structure is disposed between the sliding base and the pushing part and generates a thrust force such that the pushing part is kept in pushing the retaining wall. The retaining wall applies a reaction force to the sliding member through the pushing part to drive the sliding member and the second casing to move parallel to the extending direction relative to the first casing. Therein, a component of force of the reaction force is a driving force for the sliding member to slide on the slide. Because of the existence of the relatively shortest distance, the reaction force can include a nonzero component of force in the extending direction to push the sliding member away from the position of the relatively shortest distance. In other words, a user just needs to push the sliding member (and the second casing) over the position of the relatively shortest distance, so that the sliding member (and the second casing) can keep in moving automatically without further applying force. Therefore, the sliding mechanism of the invention can perform casing moving function without applying force through the whole moving by the user, which solves the inconvenience that a conventional slider electronic apparatus needs a continuous moving on the casing thereof by a user to reach a predetermined position.

Another objective of the invention is to provide a slider electronic apparatus, which includes the sliding mechanism of the invention. Therefore, the slider electronic apparatus uses the sliding mechanism for offering the function of casing moving automatically.

The slider electronic apparatus of the invention includes a first casing, a second casing, and a sliding mechanism. The first casing has an opening extending in an extending direction. The second casing is disposed to be capable of moving relative to the first casing. The sliding mechanism is disposed at a first side portion of the first casing and connected to the second casing. The sliding mechanism includes a slide, a retaining wall, and a sliding member. The slide is fixedly disposed in the first casing and extends in the extending direction. The retaining wall is fixedly disposed opposite to the slide in the first casing and extends substantially in the extending direction. A distance in a direction perpendicular to the extending direction between the retaining wall and the slide varies along the extending direction. The distance includes a relatively shortest distance. The sliding member includes a sliding base, a pushing part, and a thrust force generating structure. The sliding base is disposed to be slidable on the slide and connected to the second casing through the opening. The pushing part is connected to the sliding base and capable of moving relative to the sliding base. The thrust force generating structure is disposed between the sliding base and the pushing part and generates a thrust force such that the pushing part is kept in pushing the retaining wall. The retaining wall applies a reaction force to the sliding member through the pushing part to drive the sliding member and the second casing to move parallel to the extending direction relative to the first casing. Therein, a component of force of the reaction force is a driving force for the sliding member to slide on the slide. Therefore, by the automatically moving function of the sliding mechanism, the slider electronic apparatus of the invention can perform casing moving function without applying force through the whole moving by the user, which solves the inconvenience that a conventional slider electronic apparatus needs a continuous moving on the casing thereof by a user to reach a predetermined position.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
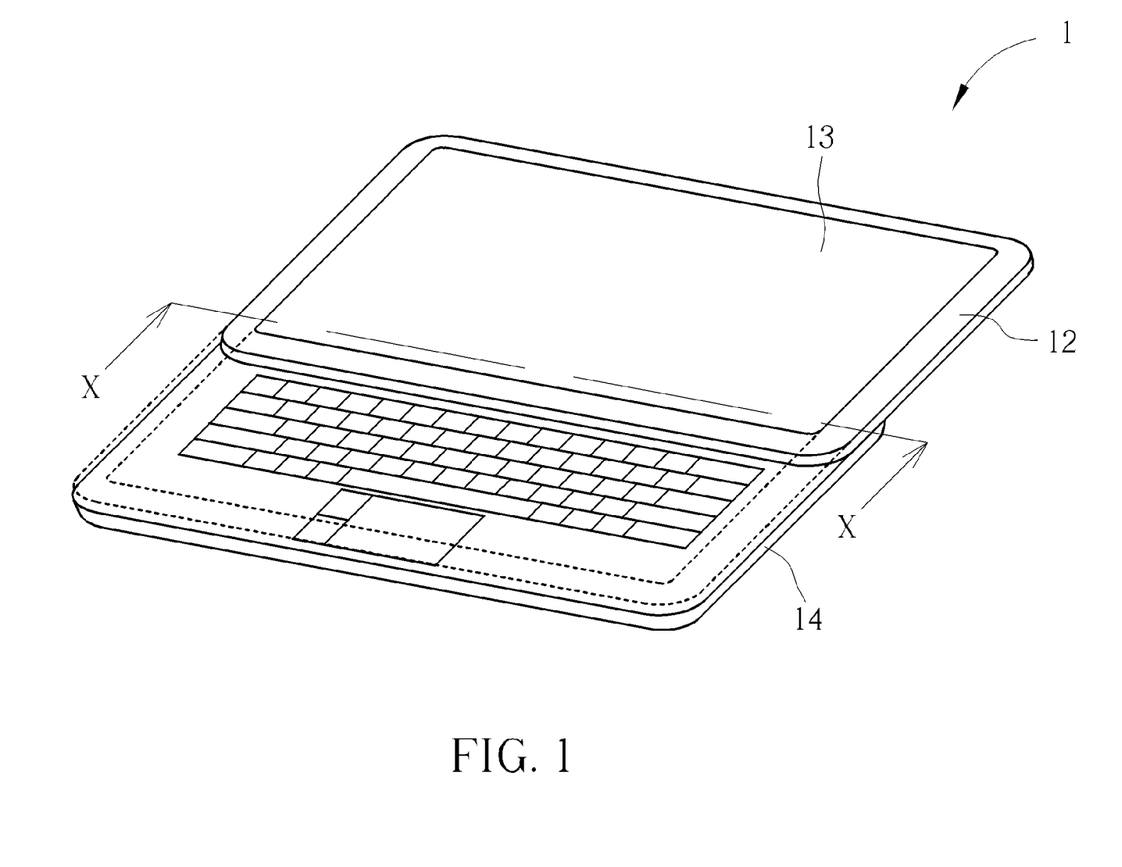
FIG. 1 is a schematic diagram illustrating a slider electronic apparatus of a preferred embodiment according to the invention.
Figure 2:
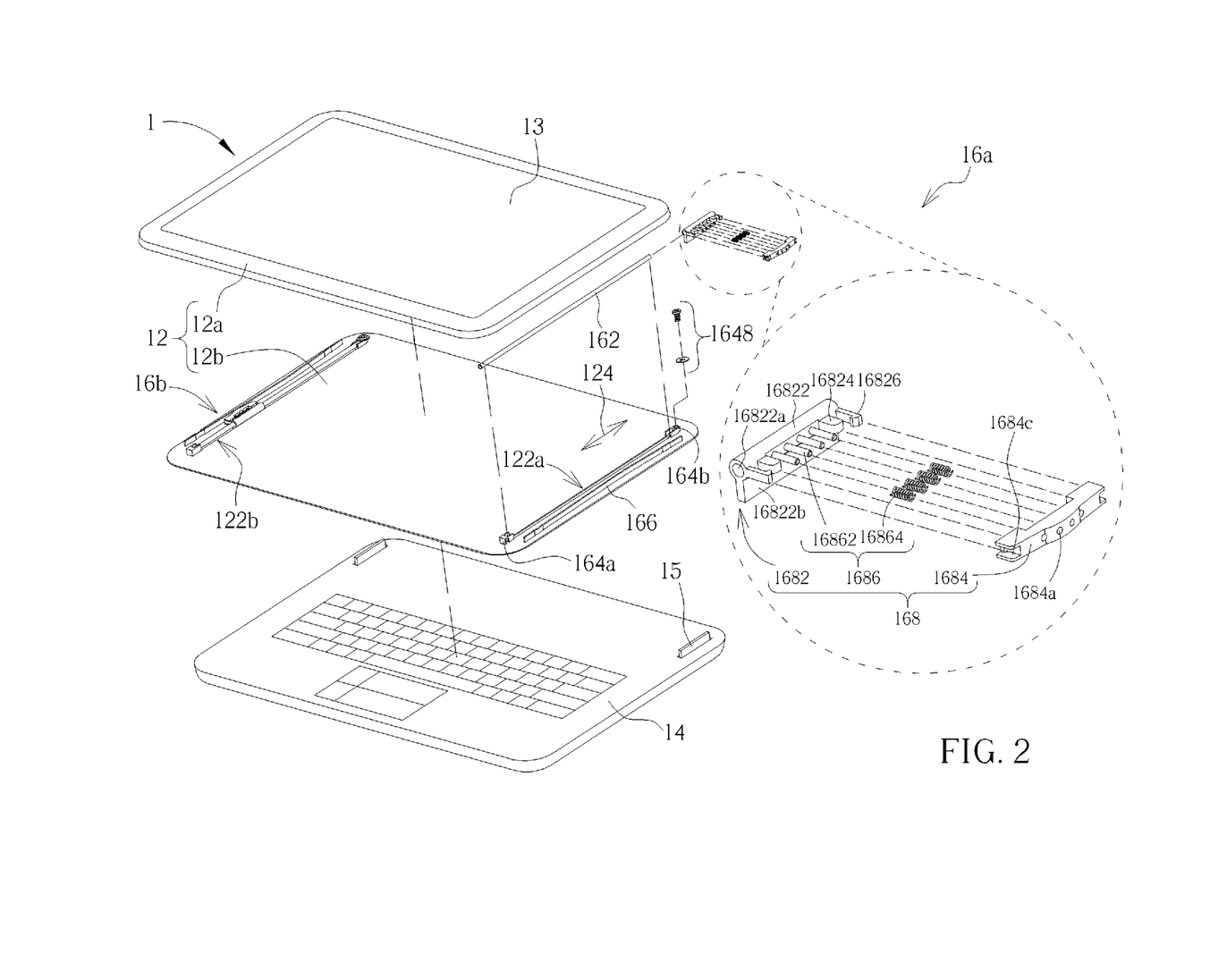
FIG. 2 is a partially exploded view of the slider electronic apparatus in FIG. 1.

Please refer to FIG. 1 and FIG. 2. FIG. 1 is a schematic diagram illustrating a slider electronic apparatus 1 of a preferred embodiment according to the invention. FIG. 2 is a partially exploded view of the slider electronic apparatus 1. The slider electronic apparatus 1 includes a first casing 12, a second casing 14, and two sliding mechanisms 16a and 16b. The sliding mechanisms 16a and 16b are installed at two opposite side portions of the first casing 12 respectively and connected to the second casing 14. For example, the sliding mechanisms 16a and 16b can be connected to the second casing 14 through a hinge (not shown in the figures). The first casing 12 can move by the sliding mechanisms 16a and 16b relative to the second casing 14. Therein, a closed status of the first casing 12 and the second casing 14 is shown by dashed lines in FIG. 1. In the embodiment, the sliding mechanisms 16a and 16b are equal in structure, which is conducive to the stability of relative movement of the first casing 12 and the second casing 14; however, the invention is not limited thereto. In addition, the first casing 12 accommodates mainly a panel module 13 (for example, including a LCD panel, a touch panel and so on). The second casing 14 accommodates mainly a system processing module (for example, including a processor, a peripheral output and input interface and so on). However, the invention is not limited thereto.

In the embodiment, the first casing 12 includes an upper cover 12a and a lower plate 12b. The upper cover 12a and the lower plate 12b are engaged to accommodate the panel module 13. The sliding mechanisms 16a and 16b are disposed on the lower plate 12b. The first casing 12 has two openings 122a and 122b formed on the lower plate 12b corresponding to the sliding mechanisms 16a and 16b and extend in an extending direction 124. The sliding mechanism 16a includes a slide 162, two fastening mounts 164a and 164b, a retaining wall 166, and a sliding member 168. So does the sliding mechanism 16b, which will not be described in addition. The following will be mainly based on the sliding mechanism 16a. The slide 162 is fixedly disposed in the first casing 12 and extends in the extending direction 124. In the embodiment, the two ends of the slide 162 are fixed on the lower plate 12b by the fastening mounts 164a and 164b fixed on the lower plate 12b, but the invention is not limited thereto. For example, the two ends of the slide 162 can be fixed on the lower plate 12b by adhesive alternatively. The retaining wall 166 is fixedly disposed opposite to the slide 162 on the lower plate 12b and extends substantially in the extending direction 124. The sliding member 168 includes a sliding base 1682, a pushing part 1684, and a thrust force generating structure 1686. The sliding base 1682 is disposed to be slidable on the slide 162 and connected to the second casing 14 through the corresponding opening 122a. The pushing part 1684 is connected to the sliding base 1682 can capable of moving relative to the sliding base 1682. The thrust force generating structure 1686 is disposed between the sliding base 1682 and the pushing part 1684 and generates a thrust force such that the pushing part 1684 is kept in pushing the retaining wall 166.

Figure 3:
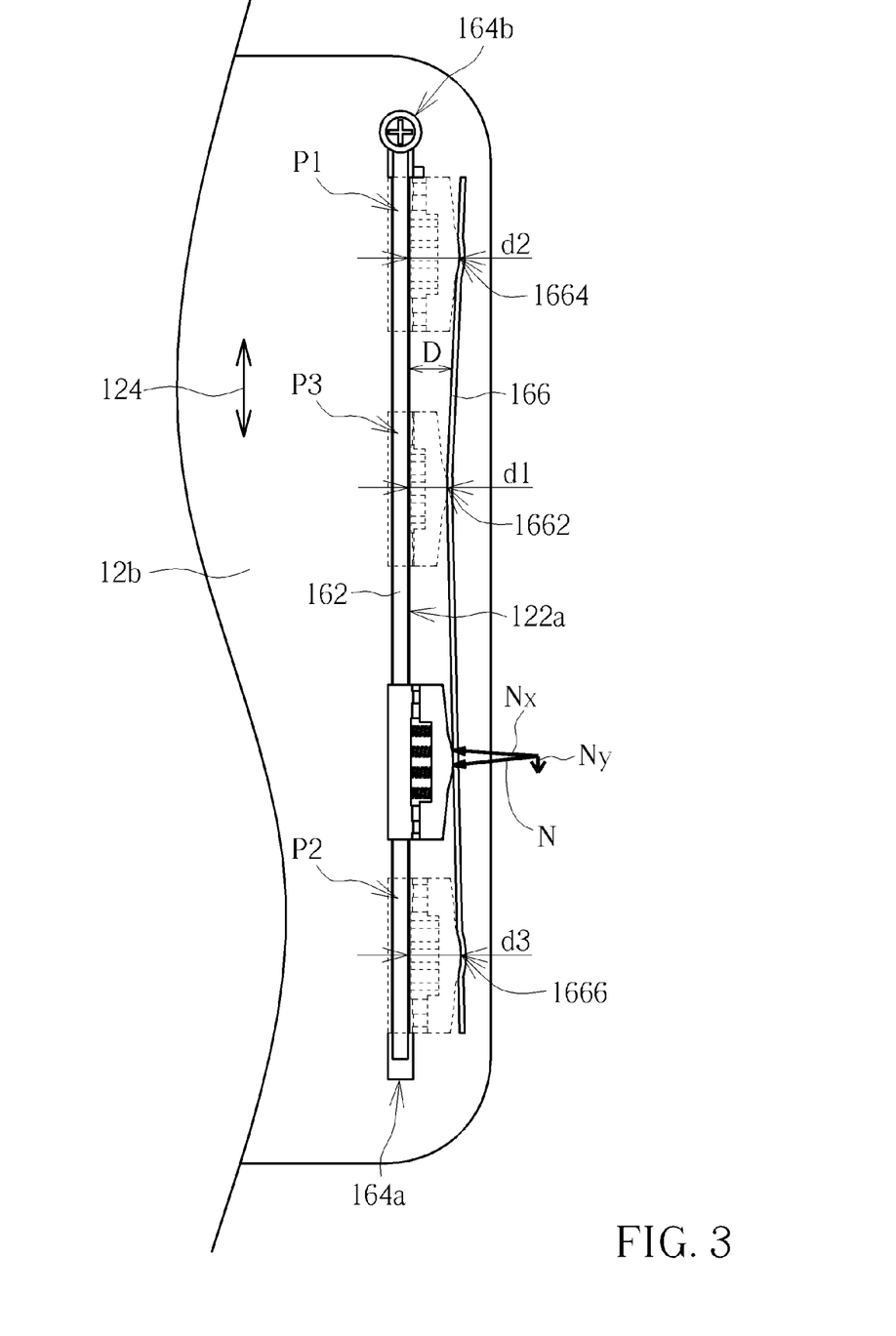
FIG. 3 is a top view illustrating the disposition of a sliding mechanism on a lower plate of the slider electronic apparatus in FIG. 2.

Please refer to FIG. 3. FIG. 3 is a top view of the slider electronic apparatus 1 for illustrating the disposition of the sliding mechanism 16a on the lower plate 12b. In the embodiment, a distance D in a direction perpendicular to the extending direction 124 between the retaining wall 166 and the slide 162 varies along the extending direction 124; that is, distances between the retaining wall 166 and the slide 162 at every position are not the same. Therein, in the embodiment, the distance D includes a relatively shortest distance d1. The slide 162 thereon defines a first stop position P1, a second stop position P2, and a critical position P3 between the first stop position P1 and the second stop position P2, indicated by arrows in FIG. 3. Therein the critical position P3 corresponds to the relatively shortest distance d1. The distance D includes a first stop distance d2 and a second stop distance d3 corresponding to the first stop position P1 and the second stop position P2 respectively, which are larger than the relatively shortest distance d1.

In the embodiment, the retaining wall 166 has a V-shaped profile. The distance in the direction perpendicular to the extending direction 124 from the apex 1662 of the V-shaped profile to the slide 162 is equal to the relatively shortest distance d1. Further, the V-shaped profile is the surface profile provided by the retaining wall 166 for the pushing part 1684 to push. In other words, in practice, the retaining wall 166 is not limited to be with uniform thickness. In principle, any structure capable of providing the required profile of the contact surface can be taken as the retaining wall. In the embodiment, on the whole, the retaining wall 166 can be logically regarded to extend substantially in the extending direction 124. On local portions, the distance D is increasingly longer from the critical position P3 to the first stop position P1; similarly, the distance D is also increasingly longer from the critical position P3 to the second stop position P2. That is, the retaining wall 166 mostly extends with a slight deviation from the extending direction 124. Hence, the direction of a reaction force N (shown by a bold arrow) applied by the retaining wall 166 through the pushing part 1684 to the sliding member 168 is not perpendicular to the extending direction 124 except for the critical position P3, the first stop position P1, and the second stop position P2, as shown in FIG. 3. That is, a component Ny of force of the reaction force N in the extending direction 124 is nonzero, so as to drive the sliding member 168 and the second casing 14 to move parallel to the extending direction 124 relative to the first casing 12. For example, when the sliding member 168 is located between the critical position P3 and the first stop position P1, the direction of the component Ny of force is upward, so as to drive the sliding member 168 to move upward; when the sliding member 168 is located between the critical position P3 and the second stop position P2, the direction of the component Ny of force is downward, so as to drive the sliding member 168 to move downward. It is added that the component Ny of force only offers a moving tendency to the sliding member 168. The actual movement of the sliding member 168 depends on an actual resultant of forces (including external forces by a user), which is known by one having ordinary skill in the art and will be not described in addition.

Furthermore, a component Nx of force of the reaction force N perpendicular to the extending direction 124 and a thrust force generated by the thrust force generating structure 1686 reach force equilibrium. It is added that for simple illustration, the foregoing is based on a condition that frictional force can be ignored, but the invention is not limited thereto. In practice, if fictional force cannot be ignored, one having ordinary skill in the art can easily involve fictional forces in the force diagram of the thrust force, the reaction force N and so on, which needs no further description. In addition, if a fictional force affects the movement of the sliding member 168, in principle, the component Ny of force needs to overcome the fictional force. In practice, it can be obtained easily by designing profile dimensions of the thrust force generating structure 1686 and the retaining wall 166 or modifying contact conditions between structural parts, which can be realized by one having ordinary skill in the art and will be not described in addition.

Figure 4:
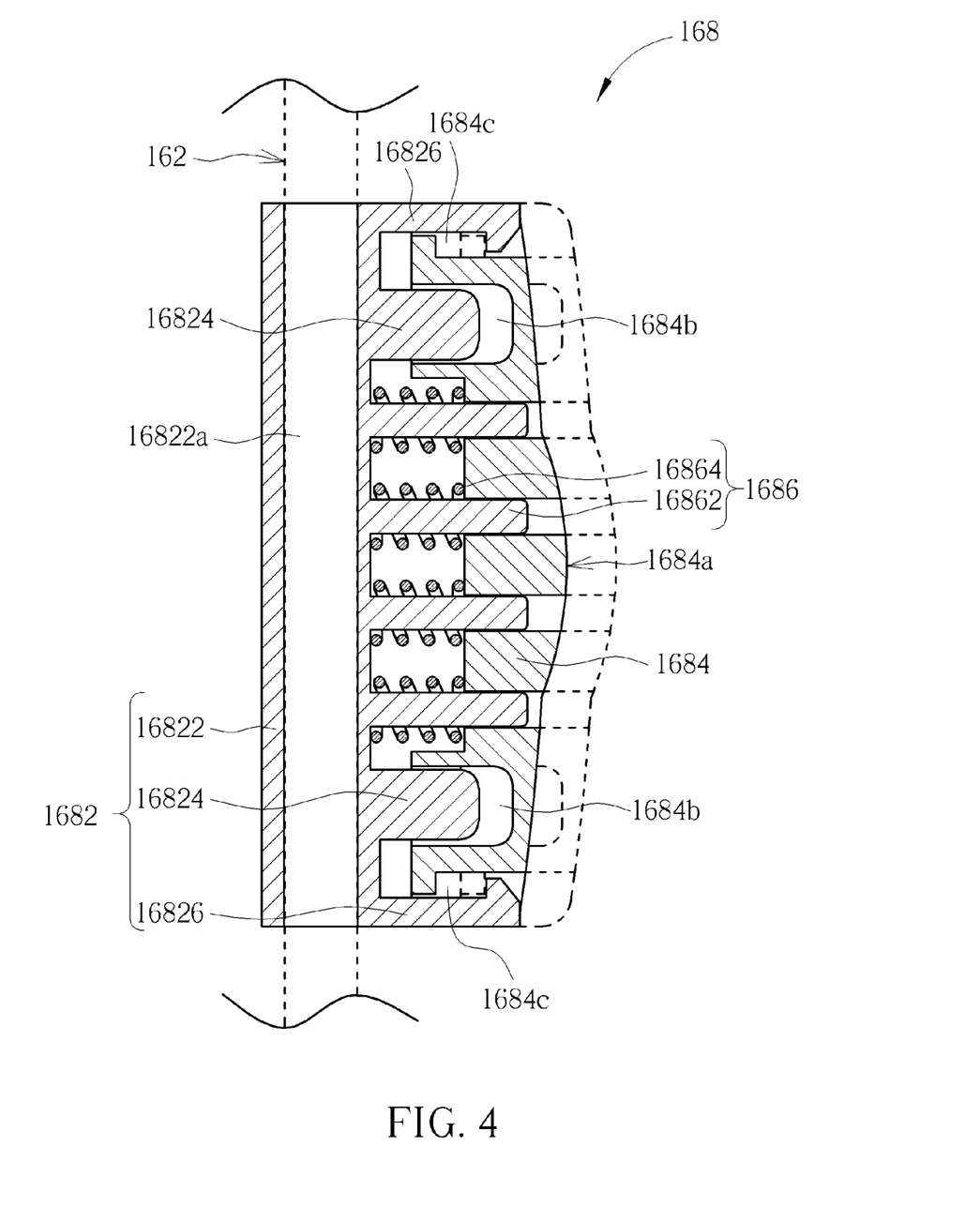
FIG. 4 is a sectional diagram illustrating a movement of the sliding member of the sliding mechanism in FIG. 2.

Please also refer to FIG. 4. FIG. 4 is a sectional diagram illustrating a movement of the sliding member 168. The sliding base 1682 includes a main body 16822, a pair of positioning bosses 16824, and a pair of hooks 16826. The main body 16822 has a through hole 16822a. The slide 162 is disposed to pass through the through hole 16822a such that the main body 16822 is disposed to be slidable on the slide 162. In the embodiment, the slide 162 is a rod; the through hole 16822a is a round hole correspondingly. The section of the through hole 16822a is substantially equal to that of the slide 162, but the invention is not limited thereto. In practice, the section of the through hole 16822a can be slightly larger than that of the slide 162, so that the sliding member 168 still can slide on the slide 162 even when slanting. The fit tolerance or allowable manufacturing tolerance of the slide 162 and the through hole 16822a also can increase. In addition, in practice, the slide 162 can be another rod with other section or any structure having guiding function.

In the embodiment, the slide 162 is disposed oppositely right to the opening 122a. The main body 16822 has a connection portion 16822b (labeled in FIG. 2). The connection portion 16822b can directly pass through the opening 122a to be connected to the second casing 14. In practice, the connection portion 16822b can be connected to the second casing 14 through a hinge 15 (indicated by a block in FIG. 2), so that when the first casing 12 slides relative to the second casing 14 to a predetermined position, the first casing 12 can be rotated relative to the second casing 14 to tilt above the second casing 14 for convenient use to users.

The positioning boss 16824 and the hook 16826 are fixedly disposed on the main body 16822 along the extending direction 124. The pushing part 1684 includes a contact surface 1684a, a pair of guiding holes 1684b, and a pair of slot structures 1684c formed at a side portion thereof. The pushing part 1684 pushes the retaining wall 166 by the contact surface 1684a. The positioning bosses 16824 are disposed to be slidable in the guiding holes 1684b correspondingly. The hooks 16826 are disposed to be slidable in the slot structures 1684c correspondingly. An end portion of the slot structure 1684c has a step structure, so that the hook 16826 can hook the slot structure 1684c for preventing the positioning boss 16824 from departing from the guiding hole 1684b. Thereby, the pushing part 1684 can move relative to the sliding base 1682 without departing from the sliding member 168. Therein, when the hook 16826 hooks the slot structure 1684c, the position of the pushing part 1684 is indicated by dashed lines in FIG. 4. It is added that the movement stability of the pushing part 1684 relative to the sliding base 1682 depends mainly on the fitting of the positioning bosses 16824 and the guiding holes 1684b. However, in the embodiment, the slot structure 1684c also can limit the sliding of the hooks 16826 in the slot structures 1684c, so it is also conducive to the movement stability of the pushing part 1684 relative to the sliding base 1682. But the invention is not limited thereto. It is added that, if the variation range of the distance D between the slide 162 and the retaining wall 166 can avoid a disengagement of the pushing part 1684 from the sliding member 168, the disposition of the hooks 16826 and the slot structures 1684c can be skipped.

In the embodiment, the thrust force generating structure 1686 includes four positioning bosses 16862 and four elastic parts 16864. The positioning bosses 16862 are fixedly disposed on the main body 16822 of the sliding base 1682. The elastic parts 16864 such as springs are sleeved on the positioning bosses 16862 correspondingly and compressed to abut against and between the main body 16822 and the pushing part 1684 of the sliding base 1682 for generating the thrust force. Because the positioning bosses 16862 are located between the positioning bosses 16824, the thrust force can be applied to the pushing part 1684 uniformly, which is conducive to the movement stability of the pushing part 1684 relative to the sliding base 1682. The positioning boss 16862 are used mainly for improving the movement stability of the elastic parts 16864. In practice, the movement stability can be improved by other ways. For example, the main body 16822 and the pushing part 1684 thereon form corresponding recesses for accommodating the two ends of the elastic part 16864 respectively, which also can improve the movement stability of the elastic part 16864. Furthermore, if the movement stability of the elastic part 16864 is sufficient by itself, the positioning bosses 16862 or recesses can be skipped. In addition, the length of the positioning boss 16862 is not limited to be longer than the natural length or a compressed length of the elastic part 16864.

The distance D between the retaining wall 166 and the slide 162 changes when the sliding member 168 slides on the slide 162. The pushing part 1684 moves relative to the sliding base 1682 correspondingly, so that the compression extent of the elastic part 16864 is also changed. That is, the thrust force changes correspondingly. The reaction force N and the components Nx and Ny of force thereof also change. In the embodiment, when the sliding member 168 is located at the critical position P3, the compression extent of the elastic part 16864 reaches a maximum, so that the thrust force reaches a maximum and so does the reaction force N. In practice, when a user moves the sliding member 168 on the slide 162 to approach the critical position P3, the user needs to apply force increasingly no matter from the first stop position P1 to the critical position P3 or from the second stop position P2 to the critical position P3. Therefore, the design for the relatively shortest distance d1 can offer hand feeling to the user for distinguishing the critical position P3. Once the sliding member 168 slides beyond the critical position P3, the sliding member 168 can keep in continuously sliding on the slide 162 by the component Ny of force without requiring the user to apply force more. The sensitivity of the hand feeling can be adjusted by designing the profile of the retaining wall 166. For example, a portion of the retaining wall 166 close to the critical position P3 can be designed to be with a round arc of a larger curvature (i.e. smaller radius) for enhancing the sensitivity, but the invention is not limited thereto.

In the embodiment, the contact surface 1684a is an arc surface, which is conducive to the movement of the pushing part 1684 on the retaining wall 166, but the invention is not limited thereto. As shown in FIG. 3, the retaining wall includes a first positioning concave surface 1664 and a second positioning concave surface 1666. The first positioning concave surface 1664 corresponds to the first stop position P1. The second positioning concave surface 1666 corresponds to the second stop position P2. The profile of the contact surface 1684a matches the profile of the first positioning concave surface 1664 and the second positioning concave surface 1666, so that the pushing part 1684 can be engaged to the first positioning concave surface 1664 when the sliding member 168 is located at the first stop position P1, and the pushing part 1684 can be engaged to the second positioning concave surface 1666 when the sliding member 168 is located at the second stop position P2. Thereby, during the movement of the sliding member 168 toward the first stop position P1 by the component Ny of force, the sliding member 168 can be stopped automatically at the first stop position P1 when the pushing part 1684 is engaged to the first positioning concave surface 1664. Similarly, during the movement of the sliding member 168 toward the second stop position P2 by the component Ny of force, the sliding member 168 can be stopped automatically at the second stop position P2 when the pushing part 1684 is engaged to the second positioning concave surface 1666.

It is added that if the influence of the component Ny of force on the abovementioned positioning function for the sliding member 168 is under consideration, the influence on the positioning function can be reduced by designing the profile of the retaining wall 166 or the profiles of the first positioning concave surface 1664 and the second positioning concave surface 1666. For example, an included angle of the extending direction of the retaining wall 166 and the extending direction of the slide 162 decreases, such that the component Ny of force is limited and a generated kinetic energy therefore is also limited. For another example, the profiles of the first positioning concave surface 1664 and the second positioning concave surface 1666 are modified to be with deeper concave depth so as to sustain a larger impact force due to an engagement of the pushing part 1684. Furthermore, in the embodiment, the profile of the contact surface 1684a and the profiles of the first positioning concave surface 1664 and the second positioning concave surface 1666 are substantially equal; for example, the surfaces 1684a, 1664 and 1666 are surfaces of the same curvature. However, the invention is not limited thereto. In principle, it is acceptable as long as the profiles of the first positioning concave surface 1664 and the second positioning concave surface 1666 can allow the pushing part 1684 to be engaged to the first positioning concave surface 1664 and the second positioning concave surface 1666; however, the invention is not limited to the profile of the contact surface 1684a being equal to the profiles of the first positioning concave surface 1664 and the second positioning concave surface 1666. In addition, in the embodiment, the first stop position P1 and the second stop position P2 are located almost at two ends of the stroke of the sliding member 168 on the slide 162, so in practice, the positioning for the sliding member 168 can be realized directly by the fastening mounts 164a and 164b blocking the sliding member 168.

It is added that in logic, the relatively shortest distance d1 means that the distance D reaches a minimum within a local area so that the sliding member 168 is unstable when sliding to the critical position P3. Any small disturbance is sufficient to make the sliding member 168 to slide away from the critical position P3 toward the neighbor stop position P1 or P2. In the embodiment, because there are only the two stop positions P1 and P2, only one critical position P3 is required; however, the invention is not limited. For example, the retaining wall 166 can be designed to be with a waved profile. In such case, the distance D between the retaining wall 166 and the slide 162 includes a plurality of relatively shortest distances. In addition to the two ends of the retaining wall 166 to be regarded as stop positions, a stop position can be defined between every adjacent two of the relatively shortest distances.

Figure 5:
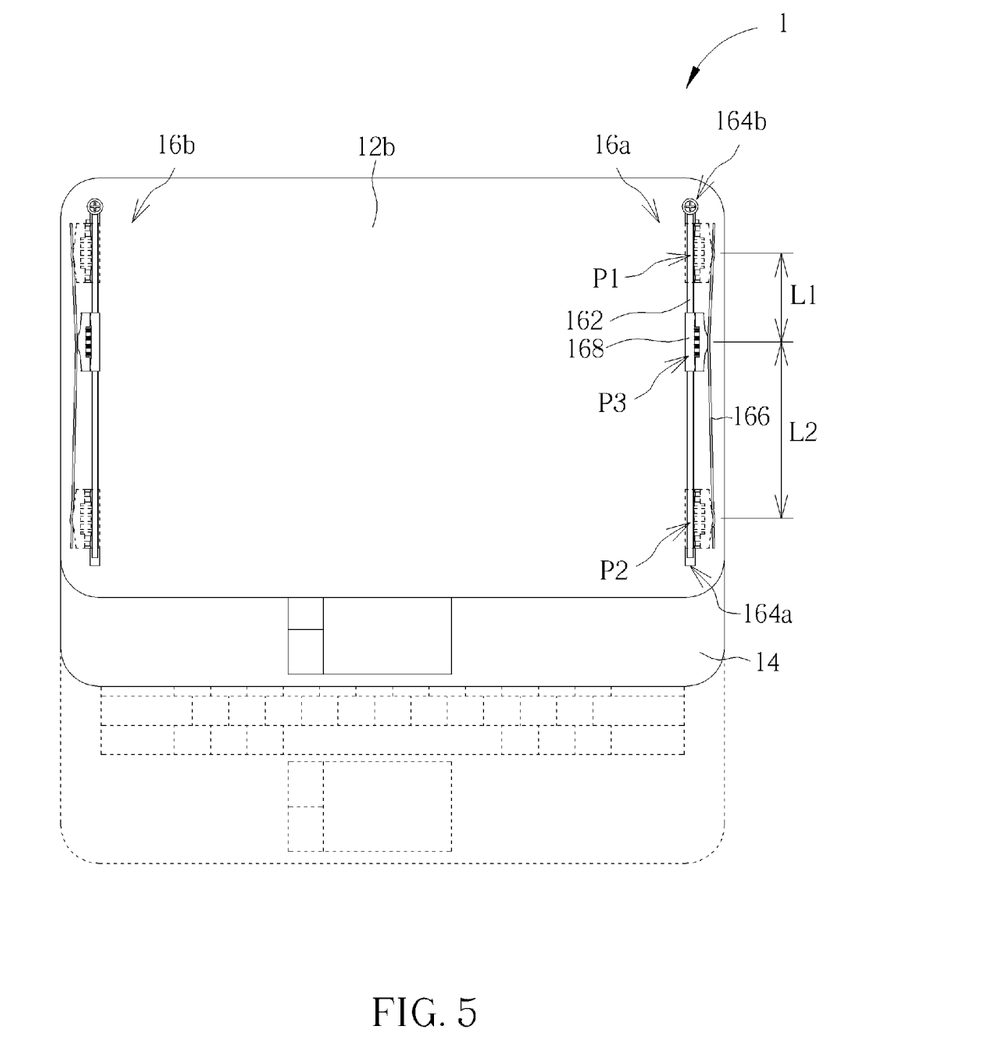
FIG. 5 is a schematic diagram illustrating the relative movement of casings of the slider electronic apparatus in FIG. 2 by the sliding mechanisms.

Please refer to FIG. 3 and FIG. 5. FIG. 5 is a schematic diagram illustrating the relative movement of the casings 12 and 14 of the slider electronic apparatus 1 by the sliding mechanisms 16a and 16b; therein, for clear observation on the movement of the sliding mechanisms 16a and 16b, only the lower plate 12b is shown for the first casing 12. The slider electronic apparatus 1 is at a close status when the sliding member 168 is located at the first stop position P1; that is, the first casing 12 and the second casing 14 overlap completely. In such case, a user can applies force such that the first casing 12 moves relative to the second casing 14. For simple illustration, in FIG. 5, the relative movement of the first casing 12 and the second casing 14 is illustrated by fixing the first casing 12 and moving the second casing 14. The second casing 14 is connected to the sliding member 168, so when the second casing 14 moves relatively, the sliding member 168 also moves relative to the slide 162. When the sliding member 168 moves from the first stop position P1 to the critical position P3, as shown by solid lines in FIG. 5, the user can continuously apply force to move the sliding member 168 over the critical position P3 in a small distance such that the sliding member 168 can keep in moving toward the second stop position P2 automatically until the pushing part 1684 is engaged to the second positioning concave surface 1666. The casing opening operation of the slider electronic apparatus 1 is therefore completed; the slider electronic apparatus 1 is shown by dashed lines in FIG. 5. Furthermore, in the embodiment, a distance L1 between the first stop position P1 and the critical position P3 is shorter than a distance L2 between the second stop position P2 and the critical position P3, so in the casing opening operation, the stroke for the user to move the first casing 12 constitutes a small portion of the whole sliding stroke, which is conducive to convenient operation to users. Similarly, if the distance L1 between the first stop position P1 and the critical position P3 is longer than the distance L2 between the second stop position P2 and the critical position P3, the casing closing operation is favored.

Figure 6:
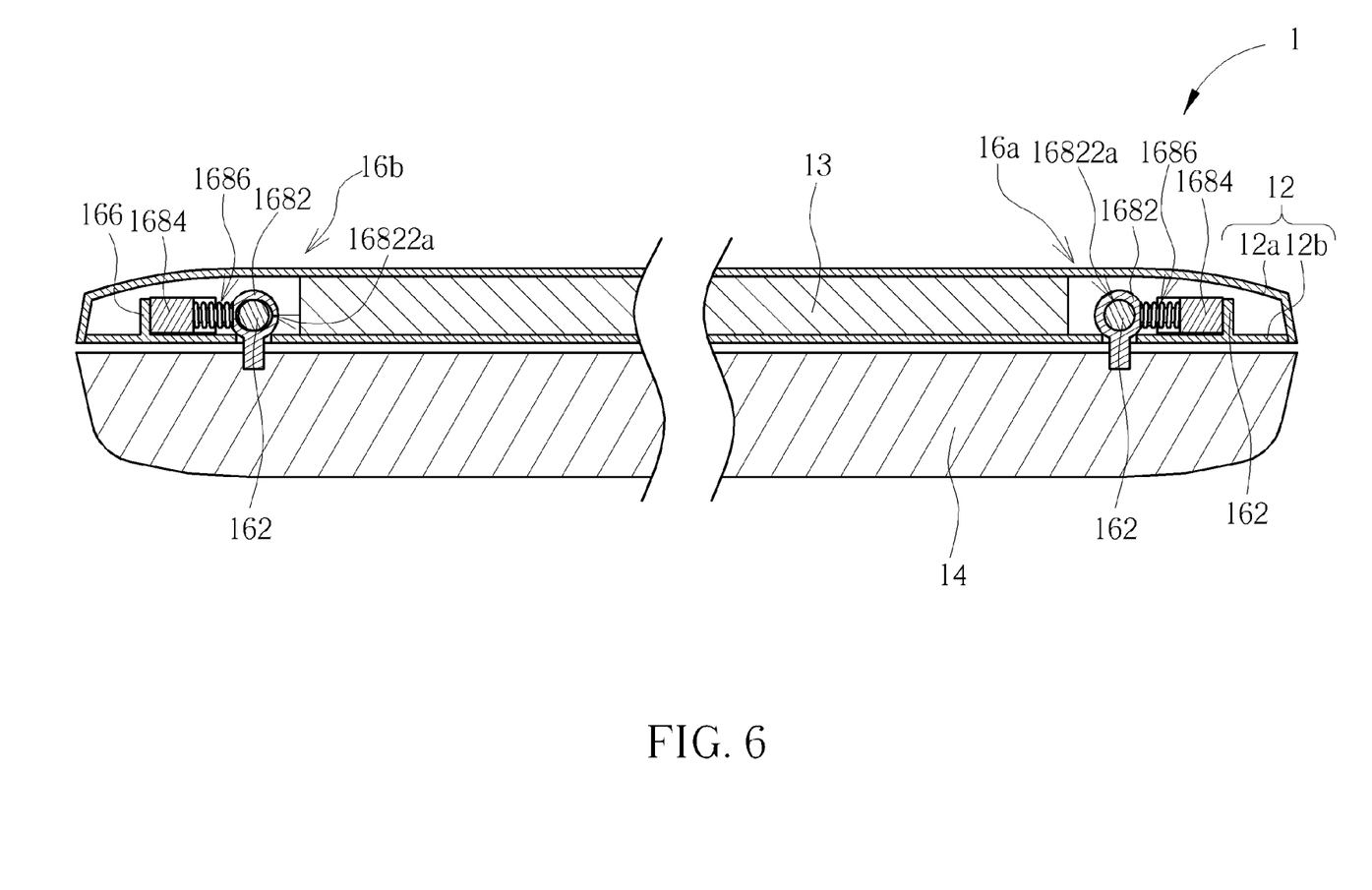
FIG. 6 is a sectional side view of the slider electronic apparatus in FIG. 1.

Please refer to FIG. 6, which is a sectional side view of the slider electronic apparatus 1. The position of the cutting plane can refer to the line X-X in FIG. 1. Therein, for simple illustration, the second casing 14 and the contents therein are shown by a single section. The second of the through hole 16822a of the sliding base 1682 of the sliding mechanism 16a is substantially equal to the section of the slide 162. The section of the through hole 16822a of the sliding base 1682 of the sliding mechanism 16b is slightly larger than the section of the slide 162. In the embodiment, the section of the through hole 16822a of the sliding base 1682 of the sliding mechanism 16b is elliptic, and the through hole 16822a extends in the direction perpendicular to the extending direction 124. Thereby, during the movement of the sliding base 1682 relative to the first casing 12, the second casing 14 connected to the sliding mechanisms 16a and 16b is permitted to slightly slant. The relevant description of the through hole 16822a of the sliding mechanism 16a in the foregoing is also applicable herein and will not be described in addition.

Figure 7:
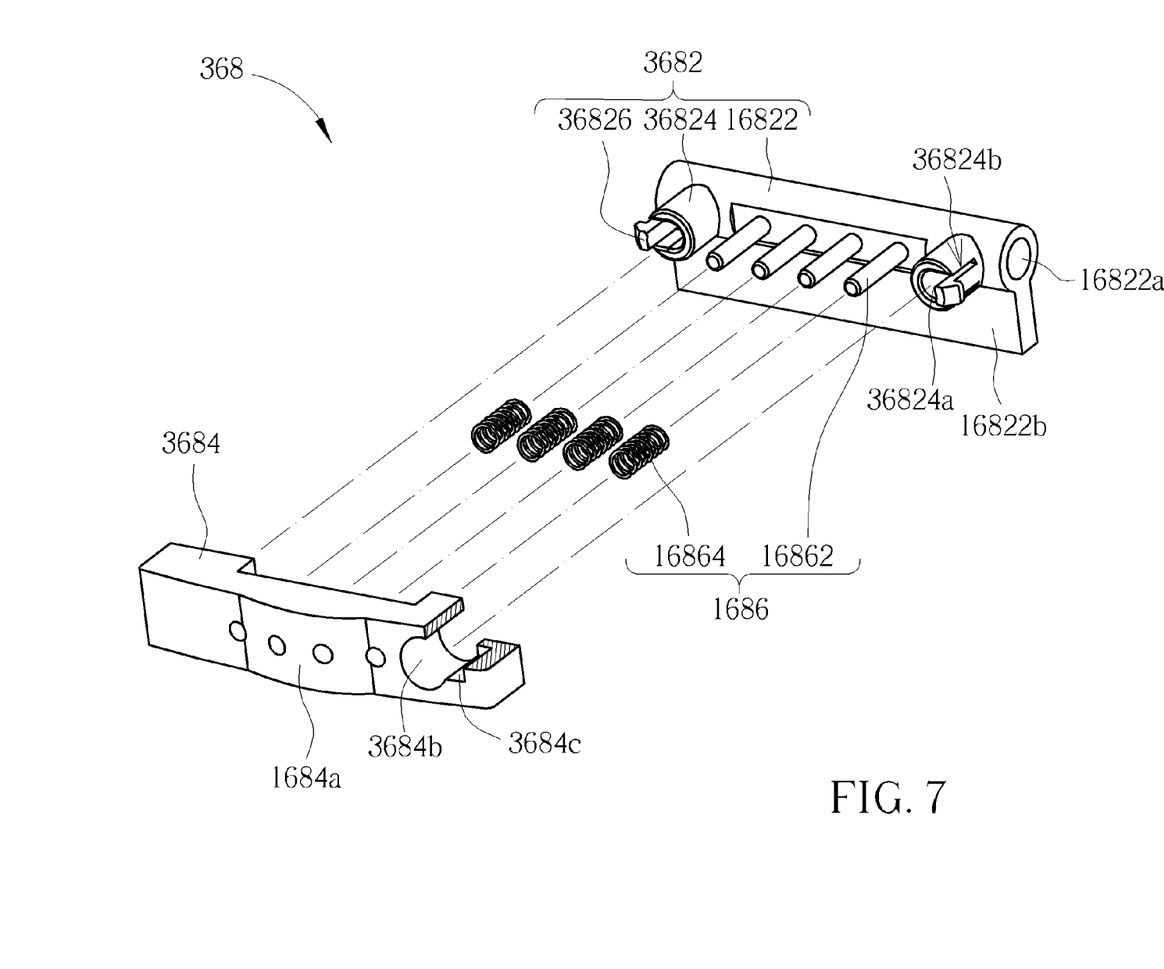
FIG. 7 is an exploded view of a sliding member according to an embodiment.

In the embodiment, the sliding member 168 hooks two sides of the pushing part 1684 by the hooks 16826 for preventing the positioning bosses 16824 from departing from the guiding holes 1684b, but the invention is not limited thereto. Please refer to FIG. 7, which is an exploded view of a sliding member 368 according to an embodiment; therein, for simple illustration of the interior structure of the pushing part 3684 of the sliding member 368, the pushing part 3684 is partially cut in the figure. The sliding member 368 and the sliding member 168 are substantially equal in structure, so the sliding member 368 still uses the component notations of the sliding member 168. The relevant description of the sliding member 168 which is applicable is also applied herein and will not be described in addition. The main difference between the sliding member 368 and the sliding member 168 is that positioning bosses 36824 and hooks 36826 of sliding base 3682 of the sliding member 368 are structurally integrated. Guiding holes 3684b and slot structure 3684c of pushing part 3684 of the sliding member 368 are also structurally integrated. The positioning boss 36824 together with the hook 36826 are disposed to be slidable in the guiding hole 3684b, which is conducive to size reduction on the sliding member 368, especially the dimension in the extending direction 124. It is added that in order to assemble the pushing part 3684 and the sliding base 3682 smoothly, the positioning boss 36824 has a center hole 36824a and the hook 36826 is disposed adjacent to the positioning boss 36824. In the embodiment, the hook 36826 is disposed at a structural breach 36824b of the positioning boss 36824. Thereby, during the assembly, the hook 36826 can deflect elastically for entering the center hole 36824a without interference.

Figure 8:
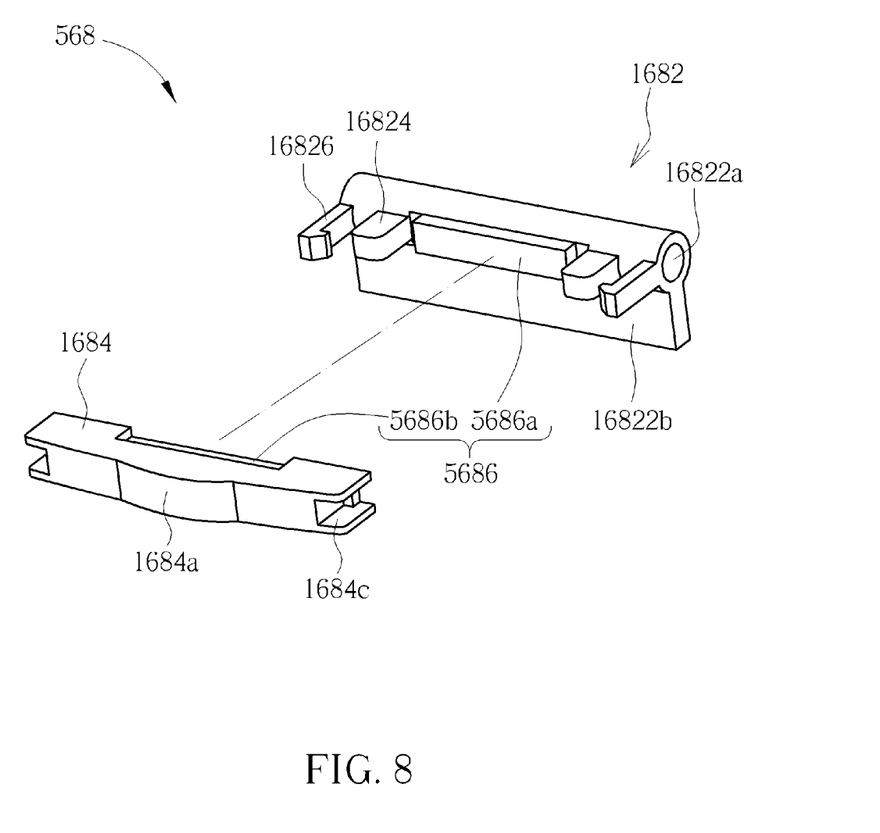
FIG. 8 is a schematic diagram illustrating a sliding member according to another embodiment.

In the embodiment, the thrust force generating structure 1686 mechanically generates the thrust force, but the invention is not limited thereto. Please refer to FIG. 8, which is a schematic diagram illustrating a sliding member 568 according to another embodiment. The sliding member 568 and the sliding member 168 are substantially equal in structure, so the sliding member 568 still uses the component notations of the sliding member 168. The relevant description of the sliding member 168 which is applicable is also applied herein and will not be described in addition. The main difference between the sliding member 568 and the sliding member 168 is that a thrust force generating structure 5686 of the sliding member 568 generates the thrust force by magnetic force. In the embodiment, the thrust force generating structure 5686 includes a pair of magnetic parts 5686a and 5686b disposed on the sliding base 1682 and the pushing part 1684 respectively. The magnetic poles of the pair of magnetic parts 5686a and 5686b are oppositely disposed for generating the thrust force.

Figure 9:
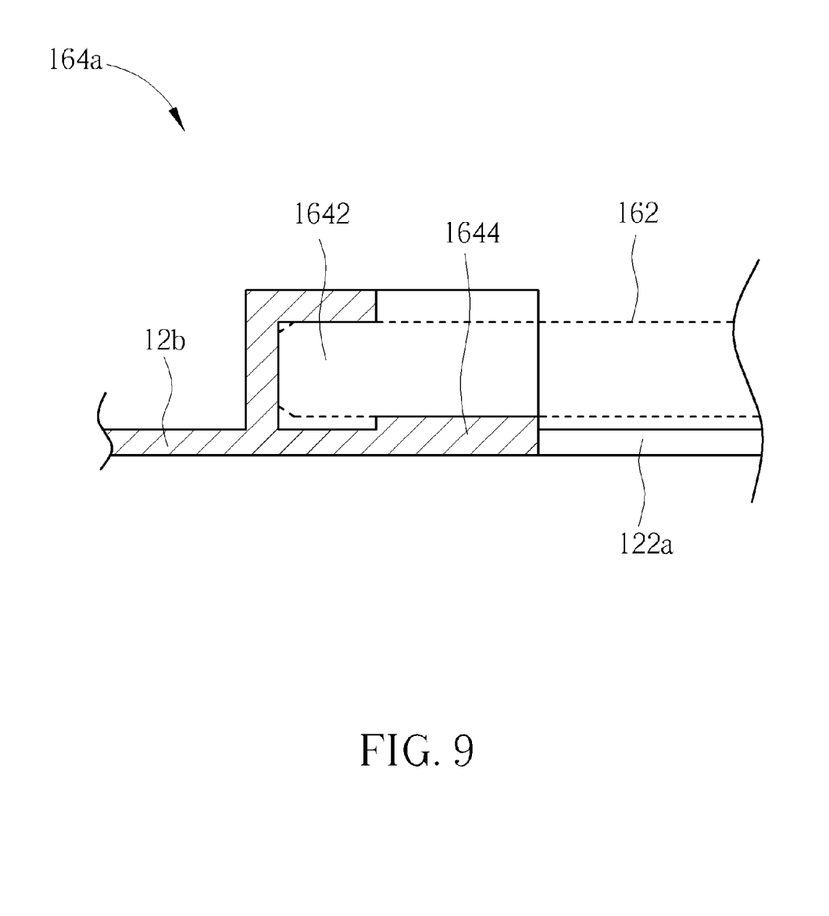
FIG. 9 is a sectional view of a fastening mount of the sliding mechanism in FIG. 2.
Figure 10:
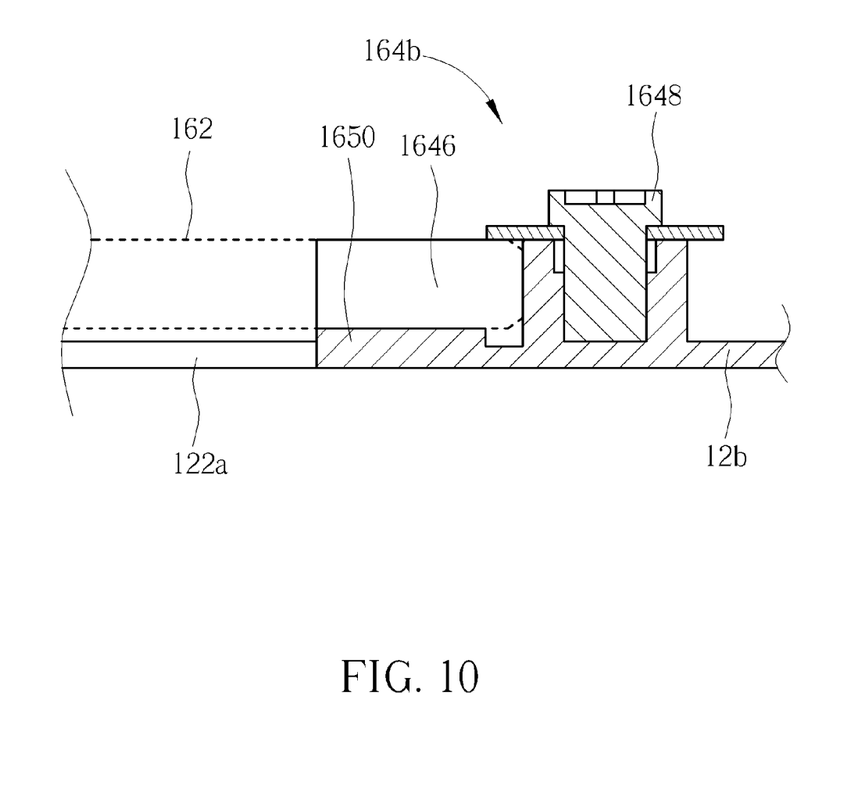
FIG. 10 is a sectional view of another fastening mount of the sliding mechanism in FIG. 2.

Please refer to FIGS. 2, 9 and 10. FIG. 9 is a sectional view of the fastening mount 164a in FIG. 2. FIG. 10 is a sectional view of the fastening mount 164b in FIG. 2. The fastening mount 164a has a slot structure 1642 and a raised platform 1644. In the embodiment, the slot structure 1642, the raised platform 1644, and the lower plate 12b are molded in one piece, but the invention is not limited thereto. The fastening mount 164b has a slot structure 1646, a fastening part 1648 (such as a screw plus a washer), and a raised platform 1650. In the embodiment, the slot structure 1646, the raised platform 1650, and the lower plate 12b are molded in one piece, but the invention is not limited thereto. In the assembly of the slide 162, an end of the slide 162 (shown by dashed lines in FIG. 9 and FIG. 10) is inserted into the slot structure 1642 to be supported by the raised platform 1644. Then, the other end of the slide 162 can be directly placed in the slot structure 1646 to be supported by the raised platform 1650, and the fastening part 1648 fastens the slide 162 for preventing the slide 162 from disengaging from the slot structure 1646.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sliding mechanism, installed in a slider electronic apparatus, the slider electronic apparatus comprising a first casing and a second casing, the sliding mechanism comprising:
    a slide fixedly disposed in the first casing and extending in an extending direction;
    a retaining wall fixedly disposed opposite to the slide in the first casing and extending substantially in the extending direction, a distance in a direction perpendicular to the extending direction between the retaining wall and the slide varying along the extending direction, the distance comprising a relatively shortest distance; and
    a sliding member comprising a sliding base, a pushing part, and a thrust force generating structure, the sliding base being disposed to be slidable on the slide and connected to the second casing, the pushing part being connected to the sliding base and capable of moving relative to the sliding base, the thrust force generating structure being disposed between the sliding base and the pushing part and generating a thrust force such that the pushing part is kept in pushing the retaining wall;
wherein the retaining wall applies a reaction force to the sliding member through the pushing part to drive the sliding member and the second casing to move parallel to the extending direction relative to the first casing.

2. The sliding mechanism of claim 1, wherein the slide is a rod, and two ends of the rod are fixed on the first casing respectively by a fastening mount.

3. The sliding mechanism of claim 1, wherein the slide thereon defines a first stop position, a second stop position, and a critical position between the first stop position and the second stop position, the critical position corresponds to the relatively shortest distance, the retaining wall comprises a first positioning concave surface and a second positioning concave surface, when the sliding member is located at the first stop position, the pushing part is engaged to the first positioning concave surface, and when the sliding member is located at the second stop position, the pushing part is engaged to the second positioning concave surface.

4. The sliding mechanism of claim 3, wherein the pushing part has a contact surface, the pushing part pushes the retaining wall by the contact surface, and a profile of the contact surface matches with a profile of the first positioning concave surface.

5. The sliding mechanism of claim 4, wherein the contact surface is an arc surface.

6. The sliding mechanism of claim 3, wherein a distance from the first stop position to the critical position is unequal to a distance from the second stop position to the critical position.

7. The sliding mechanism of claim 1, wherein the retaining wall has a V-shaped profile, and a distance in a direction perpendicular to the extending direction from an apex of the V-shaped profile to the slide is equal to the relatively shortest distance.

8. The sliding mechanism of claim 1, wherein the sliding base has a through hole, the slide is a rod passing through the through hole, and a section of the through hole is larger than a section of the rod.

9. The sliding mechanism of claim 1, wherein the sliding base comprises a main body, a positioning boss, and a hook, the main body is disposed to be slidable on the slide, the positioning boss and the hook are fixedly disposed on the main body, the pushing part has a guiding hole, the positioning boss is disposed to be slidable in the guiding hole, and the hook is capable of hooking the pushing part for preventing the positioning boss from departing from the guiding hole.

10. The sliding mechanism of claim 9, wherein the pushing part comprises a slot structure at a side thereof, and the hook is disposed to be slidable on the slot structure and capable of hooking the slot structure for preventing the positioning boss from departing from the guiding hole.

11. The sliding mechanism of claim 9, wherein the positioning boss has a center hole, the hook is disposed to be adjacent to the positioning boss and be slidable in the guiding hole, and the hook is capable of elastically deflecting to enter the center hole.

12. The sliding mechanism of claim 1, wherein the thrust force generating structure comprises an elastic part, and the elastic part is compressed to abut against and between the sliding base and the pushing part for generating the thrust force.

13. The sliding mechanism of claim 12, wherein the thrust force generating structure comprises a positioning boss fixedly disposed on the sliding base, and the elastic part is a spring sleeved on the positioning boss.

14. The sliding mechanism of claim 1, wherein the thrust force generating structure comprises a pair of magnetic parts disposed on the sliding base and the pushing part respectively, and the magnetic poles of the pair of magnetic parts are oppositely disposed for generating the thrust force.

15. A slider electronic apparatus, comprising:
a first casing having an opening extending in an extending direction;
a second casing disposed to be capable of moving relative to the first casing; and
a sliding mechanism disposed at a first side portion of the first casing and connected to the second casing, the sliding mechanism comprising:
 a first slide fixedly disposed in the first casing and extending in the extending direction;
 a retaining wall fixedly disposed opposite to the first slide in the first casing and extending substantially in the extending direction, a distance in a direction perpendicular to the extending direction between the retaining wall and the first slide varying along the extending direction, the distance comprising a relatively shortest distance; and
 a first sliding member comprising a sliding base, a pushing part, and a thrust force generating structure, the sliding base being disposed to be slidable on the first slide and connected to the second casing through the opening, the pushing part being connected to the sliding base and capable of moving relative to the sliding base, the thrust force generating structure being disposed between the sliding base and the pushing part and generating a thrust force such that the pushing part is kept in pushing the retaining wall;
wherein the retaining wall applies a reaction force to the first sliding member through the pushing part to drive the first sliding member and the second casing to move parallel to the extending direction relative to the first casing.

16. The slider electronic apparatus of claim 15, wherein the first slide is disposed oppositely right to the opening.

17. The slider electronic apparatus of claim 15, wherein the first slide thereon defines a first stop position, a second stop position, and a critical position between the first stop position and the second stop position, the critical position corresponds to the relatively shortest distance, the retaining wall comprises a first positioning concave surface and a second positioning concave surface, when the first sliding member is located at the first stop position, the pushing part is engaged to the first positioning concave surface, and when the first sliding member is located at the second stop position, the pushing part is engaged to the second positioning concave surface.

18. The slider electronic apparatus of claim 17, wherein the pushing part has an arc surface, the pushing part pushes the retaining wall by the arc surface, and a profile of the first positioning concave surface matches with a profile of the contact surface.

19. The slider electronic apparatus of claim 15, wherein the sliding base comprises a main body, a positioning boss, and a hook, the main body is disposed to be slidable on the first slide, the positioning boss and the hook are fixedly disposed on the main body, the pushing part has a guiding hole, the positioning boss is disposed to be slidable in the guiding hole, and the hook is capable of hooking the pushing part for preventing the positioning boss from departing from the guiding hole.

20. The slider electronic apparatus of claim 15, further comprising a second sliding mechanism disposed at a second side portion of the first casing and connected to the second casing, the second side portion being opposite to the first side portion, the second sliding mechanism comprising a second slide and a second sliding member, the second slide being fixedly disposed in the first casing and extending in the extending direction, the second sliding member being disposed to be slidable on the second slide and connected to the second casing through another opening of the first casing, wherein the sliding base of the first sliding member has a first through hole, the first slide is a first rod passing through the first through hole, a section of the first through hole is larger than a section of the first rod, the second sliding member has a second through hole, the second slide is a second rod passing through the second through hole, and a section of the second through hole is substantially equal to a section of the second rod.

\* \* \* \* \*